US010720894B2

(12) United States Patent
Moise et al.

(10) Patent No.: US 10,720,894 B2
(45) Date of Patent: Jul. 21, 2020

(54) INVERSE CLASS-F POWER AMPLIFIER

(71) Applicant: Cape Peninsula University of Technology, Bellville, Cape Town (ZA)

(72) Inventors: Safari Mugisho Moise, Cape Town (ZA); Clive Whaits, Cape Town (ZA)

(73) Assignee: Cape Peninsula University of Technology, Bellville, Cape Town (ZA)

(*) Notice: Subject to any disclaimer, the term of this patent is extended or adjusted under 35 U.S.C. 154(b) by 0 days.

(21) Appl. No.: 16/093,032

(22) PCT Filed: Apr. 13, 2017

(86) PCT No.: PCT/IB2017/052131
§ 371 (c)(1),
(2) Date: Oct. 11, 2018

(87) PCT Pub. No.: WO2017/179000
PCT Pub. Date: Oct. 19, 2017

(65) Prior Publication Data
US 2019/0131940 A1    May 2, 2019

(30) Foreign Application Priority Data
Apr. 15, 2016  (ZA) .................................. 2016/02559

(51) Int. Cl.
*H03F 3/217*  (2006.01)
*H03F 1/56*  (2006.01)
(Continued)

(52) U.S. Cl.
CPC ............ *H03F 3/2171* (2013.01); *H03F 1/56* (2013.01); *H03F 1/565* (2013.01); *H03F 3/193* (2013.01);
(Continued)

(58) Field of Classification Search
CPC .......... H03F 3/2171; H03F 3/217; H03F 3/60; H03F 1/56; H03F 3/193; H03F 1/565;
(Continued)

(56) References Cited

U.S. PATENT DOCUMENTS 8,947,166 B2 * 2/2015 Uno ...................... H03F 1/0205
                                                    330/302
9,319,010 B1 * 4/2016 Staudinger ............ H03F 3/2171
(Continued)

FOREIGN PATENT DOCUMENTS

KR       2011 0033383       3/2011
WO       WO 2010/142462    12/2010

OTHER PUBLICATIONS

Grebennikov, "High-Efficiency Transmission-Line Inverse Class F Power Amplifiers for 2-GHz WCDMA Systems," *Wiley Periodicals, Inc.*, Published online May 10, 2011, www.wileyonlinelibrary.com.
(Continued)

*Primary Examiner* — Khanh V Nguyen
(74) *Attorney, Agent, or Firm* — Womble Bond Dickinson (US) LLP

(57) ABSTRACT

A power amplifier is provided having an input for receiving a signal to be amplified that is associated with a fundamental frequency. An amplifier circuit of the power amplifier includes an active device for amplifying the input signal and an output for providing the amplified signal to a load. A load network is electrically interposed between the amplifier circuit and the output and includes fundamental frequency matching circuitry which presents an optimal resistance at the fundamental frequency. The load network further includes a parallel transmission line arrangement having, at the fundamental frequency, a one-eighth wavelength short-circuited stub and a one-eighth wavelength open-circuit stub. The fundamental frequency matching circuitry and the
(Continued)

parallel transmission line arrangement cooperate such that the load network operatively presents an optimal resistance at the fundamental frequency, an open-circuit at a second harmonic frequency and a short-circuit at a third harmonic frequency.

13 Claims, 5 Drawing Sheets

(51) Int. Cl.
    *H03F 3/60* (2006.01)
    *H03F 3/193* (2006.01)

(52) U.S. Cl.
    CPC ............... *H03F 3/217* (2013.01); *H03F 3/60* (2013.01); *H03F 2200/387* (2013.01); *H03F 2200/423* (2013.01); *H03F 2200/451* (2013.01)

(58) Field of Classification Search
    CPC ......... H03F 2200/451; H03F 2200/423; H03F 2200/387; H03F 3/2173; H03F 3/191; H03F 3/1935; H03F 2200/372
    USPC ............................. 330/207 A, 251, 277, 302
    See application file for complete search history.

(56) References Cited

U.S. PATENT DOCUMENTS 9,397,616 B2 * 7/2016 Donati .................... H03F 3/604
2009/0039962 A1 * 2/2009 Uno ......................... H03F 1/56
                                                                                          330/286

OTHER PUBLICATIONS

Grebennikov, "Load Network Design Technique for Class F and Inverse Class F Pas," *High Frequency Electronics*, 2011.

Titian et al., "High-Efficiency Low-Voltage-Stress Class-EF PA with Extended Maximum Operating Frequency," *Microwave Conference (GEMIC)*, Mar. 14-16, 2011 *German, IEEE*.

* cited by examiner

INVERSE CLASS-F POWER AMPLIFIER

CROSS-REFERENCE TO RELATED APPLICATIONS

The present application is a U.S. National Stage Application of International Patent Application PCT/IB2017/052131, filed Apr. 13, 2017 and claims priority to South African Patent Application No. 2016/02559, filed Apr. 15, 2016, the disclosures of each being incorporated herein by reference in their entirety.

FIELD OF THE INVENTION

This invention relates to an inverse Class-F power amplifier, and in particular to a load network of an inverse Class-F power amplifier.

BACKGROUND TO THE INVENTION

In wireless communication systems, power amplifiers (PAs) may be used in the final stage of a transmitter to increase power in a transmitted signal. The PAs typically include an active device such as a transistor and convert direct current (DC) power into radio-frequency (RF) power while being driven by a RF input signal. The portion of DC power that is not converted into RF power is dissipated as heat and constitutes a loss of power. The power conversion mechanism that takes place in a PA is described by the power conversion efficiency (PE) and the power added efficiency (PAE).

The power conversion efficiency is typically formulated as the percentage of the DC power that is converted into useful RF output signal power, while the power added efficiency is typically formulated as the percentage of DC power that is converted into useful RF output signal power while taking into account the effect of the RF input (or drive) signal.

It is often the case in wireless communication systems that the PA is the primary consumer of DC power. The power conversion efficiency is therefore an important performance parameter of the PA. A higher power conversion efficiency may for example lead to longer battery lifetime, simpler thermal management requirements and reduced form factor of the PA, amongst others.

It has been shown that the power conversion efficiency can be maximised by ensuring that the DC power is equal to the power ultimately delivered to the load at the fundamental frequency.

This occurs when the sum of power dissipated in the active device and the power delivered to the load at harmonic frequencies is zero. It is known that two necessary and sufficient conditions may fulfil these requirements: firstly by ensuring that the drain voltage and current of the active device do not overlap and secondly by terminating the drain of the active device with appropriate impedances at harmonic frequencies.

These two necessary and sufficient conditions can be fulfilled by ensuring that the drain voltage of the active device is a half sinusoidal waveform and the current waveform is square. PAs typically include a load network which is designed to aid fulfillment of these conditions. An inverse Class-F PA can fulfil the necessary and sufficient conditions to obtain the maximum theoretical power conversion efficiency if the load network presents the following impedances to the drain of the active device:

$$Z_n = \begin{cases} \frac{\pi^2}{8} \frac{V_{DD}}{I_0} = R_{opt} & n = 1 \\ 0 & n \text{ is odd} \\ \infty & n \text{ is even} \end{cases} \quad (1)$$

where $Z_n$ is the impedance presented by the load network to the drain terminal of the active device, $V_{DD}$ is the drain voltage, $I_0$ is the drain current at the fundamental frequency, $R_{opt}$ is the theoretical optimal resistance and n is the order of harmonic.

However, there are some load network designs which meet the abovementioned necessary and sufficient conditions to some degree. As a result, the efficiency of existing PAs vary somewhat.

Accordingly, there is scope for improvement.

SUMMARY OF THE INVENTION

In accordance with the invention there is provided a power amplifier comprising:
an input for receiving a signal to be amplified, the signal being associated with a fundamental frequency;
an amplifier circuit including an active device for amplifying the input signal;
an output for providing the amplified signal to a load; and,
a load network electrically interposed between the amplifier circuit and the output and including:
  fundamental frequency matching circuitry which presents an optimal resistance at the fundamental frequency and a parallel transmission line arrangement, the parallel transmission line arrangement including, at the fundamental frequency, a one-eighth wavelength short-circuited stub and, at the fundamental frequency, a one-eighth wavelength open-circuit stub, wherein the fundamental frequency matching circuitry is arranged to cooperate with the parallel transmission line arrangement such that the load network operatively presents:
  an optimal resistance at the fundamental frequency,
  an open-circuit at a second harmonic of the fundamental frequency, and
  a short-circuit at a third harmonic of the fundamental frequency.

A further feature provides for the fundamental frequency matching circuitry to include a first portion and a second portion, the parallel transmission line arrangement being interposed between the first and second portions.

The power amplifier including the one-eighth wavelength stubs, each respectively extending from a first junction which is electrically coupled to the fundamental frequency matching circuitry and to the output.

The parallel transmission line arrangement operatively presents, at the first junction, an open-circuit condition at the fundamental frequency, a short-circuit condition at a second harmonic of the fundamental frequency and an open-circuit condition at a third harmonic of the fundamental frequency.

A further feature provides for the fundamental frequency matching circuitry to include a first series-connected transmission line having a first electrical length at the fundamental frequency and being electrically interposed between the amplifier circuit and the first junction; a second series-connected transmission line having a second electrical length at the fundamental frequency and being electrically interposed between the first junction and the output; and, at the fundamental frequency, a one-twelfth wavelength open-circuit stub electrically interposed between the second series-connected transmission line and the output.

An additional feature provides for the power amplifier to be an inverse Class F power amplifier.

The invention extends to a load network for an inverse Class-F power amplifier, the load network being arranged to be electrically interposed between an amplifier circuit and an output of the inverse Class-F power amplifier and comprising:

fundamental frequency matching circuitry which presents an optimal resistance at the fundamental frequency; and, a parallel transmission line arrangement, the parallel transmission line arrangement including, at the fundamental frequency, a one-eighth wavelength short-circuited stub and, at the fundamental frequency, a one-eighth wavelength open-circuit stub, each of which extends respectively from a first junction which is electrically coupled to the fundamental frequency matching circuitry and which is arranged to be electrically coupled to the output, wherein the fundamental frequency matching circuitry is arranged to cooperate with the parallel transmission line arrangement such that the load network operatively presents:
an optimal resistance at the fundamental frequency,
an open-circuit at a second harmonic of the fundamental frequency, and
a short-circuit at a third harmonic of the fundamental frequency.

The parallel transmission line arrangement operatively presents, at the first junction, an open-circuit condition at the fundamental frequency, a short-circuit condition at a second harmonic of the fundamental frequency and an open-circuit condition at a third harmonic of the fundamental frequency.

A further feature provides for the fundamental frequency matching circuitry to include a first series-connected transmission line having a first electrical length at the fundamental frequency and being configured to be electrically connected to the amplifier circuit and which is connected to the first junction; a second series-connected transmission line having a second electrical length at the fundamental frequency and being electrically connected to the first junction and being configured to be electrically connected to the output; and, at the fundamental frequency, a one-twelfth wavelength open-circuit stub electrically interposed between the second series-connected transmission line and the output.

An embodiment of the invention will now be described, by way of example only, with reference to the accompanying drawings.

DETAILED DESCRIPTION WITH REFERENCE TO THE DRAWINGS

Figure 1:
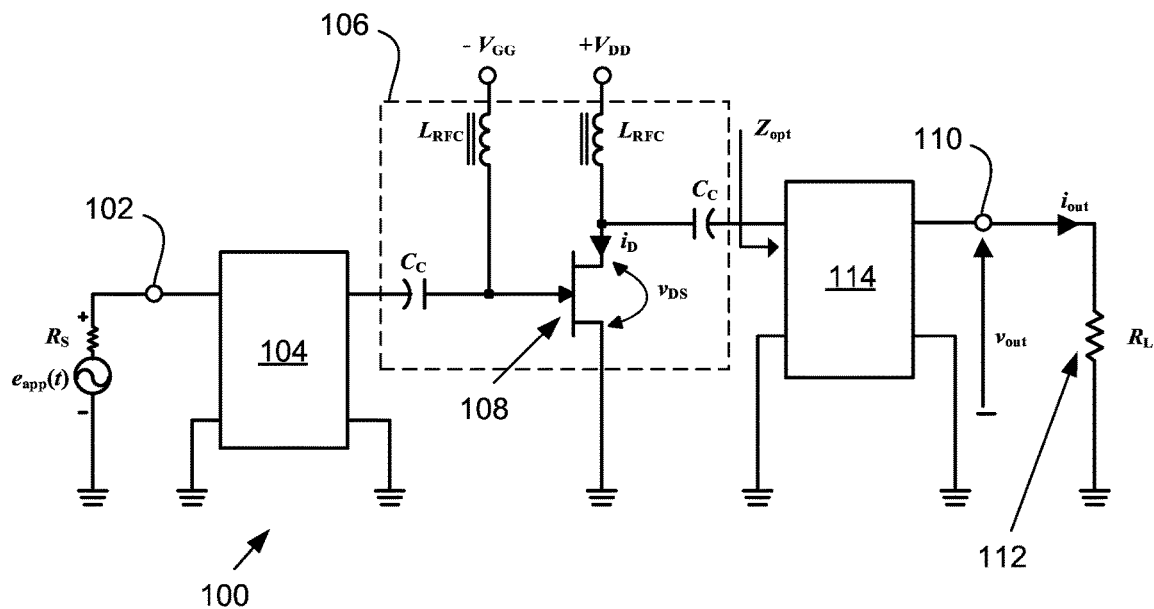
FIG. 1 is a circuit diagram which illustrates an exemplary inverse Class-F power amplifier.

FIG. 1 illustrates one embodiment of an inverse Class-F power amplifier (PA) (100). The PA (100) includes an input (102) which is arranged to receive a signal to be amplified from a source. The signal supplied to the input (102) of the PA (100) is a high-frequency signal, such as a radio-frequency (RF) signal, and is associated with a fundamental frequency ($f_0$). The PA (100) described herein is designed for use in the final stage of a transmitter in a wireless communication system and is configured to convert direct current (DC) power into RF power while being driven by a RF input signal. It should however be appreciated that the PA (100) may be adapted for use in other applications and for operation in other frequency bands, such as microwave frequencies.

The PA (100) may include an input matching network (104) which is arranged to match the input impedance of the PA (100) to the source impedance. The input matching network (104) may be provided by a suitable arrangement of transmission lines. One exemplary arrangement includes a series stub followed by an open-circuit shunt stub, although other arrangements may also be possible.

The PA (100) includes an amplifier circuit (106). The amplifier circuit (106) includes an active device (108) which is arranged to amplify the input signal. The active device (108) may for example be a transistor, such as a gallium nitride (GaN) high-electron-mobility transistor (HEMT). The active device (108) is electrically coupled to a direct-current (DC) supply, the input (102) (via the input matching network (104)) and an output (110) of the PA (100), which is arranged to provide the amplified signal to a load (112), such as an antenna.

Figure 2:
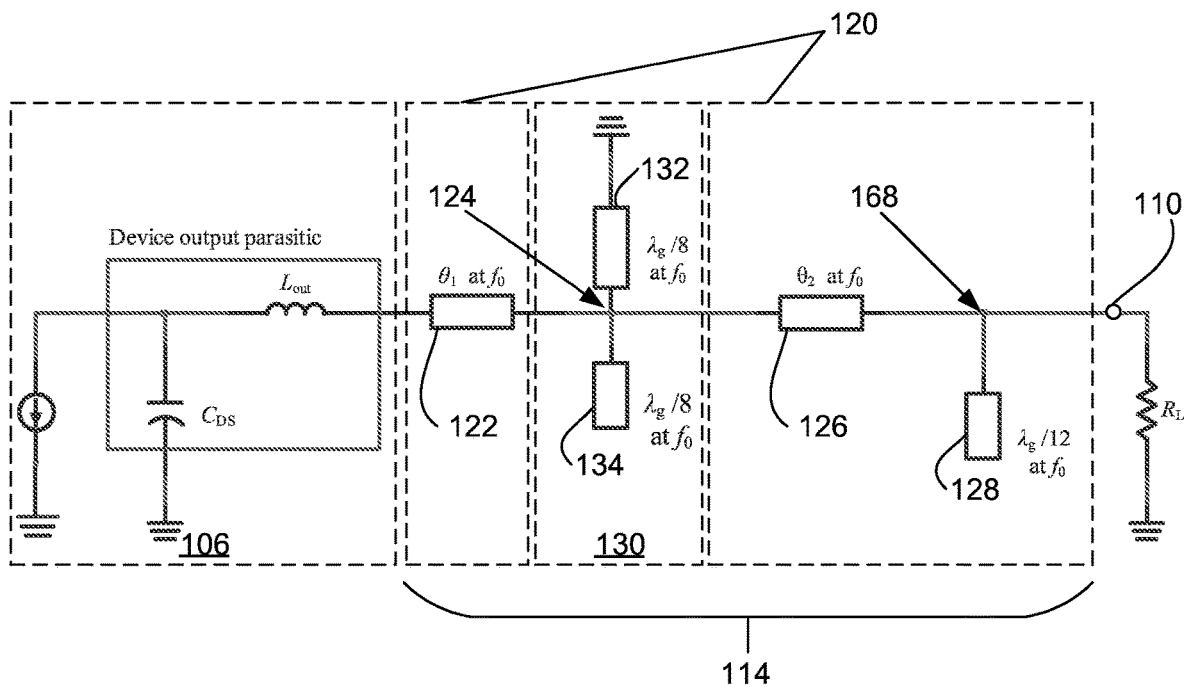
FIG. 2 is a circuit diagram which illustrates one exemplary embodiment of a load network.

The PA (100) includes a load network (114) which is electrically interposed between the amplifier circuit (106) and the output (110). The load network (114), which is illustrated in greater detail in FIG. 2, includes fundamental frequency matching circuitry (120) and a parallel transmission line arrangement (130). In order to account for parasitic effects of the amplifier circuit (106), a shunt capacitor ($C_{DS}$) and series inductor ($L_{out}$) are also illustrated. The shunt capacitor represents the drain capacitance ($C_{DS}$), or parasitic capacitance, while the series inductor represents the lead inductor ($L_{out}$), or parasitic inductance, of the active device (108). The values of these components are typically particular to the active device (108) and are generally specified by the manufacturer of the active device (108).

The fundamental frequency matching circuitry (120) is arranged to present the optimal resistance ($R_{opt}$) at the fundamental frequency ($f_0$). As will be explained in greater detail below, the fundamental frequency matching circuitry (120) is further arranged to cooperate with the parallel transmission line arrangement (130) such that the load network (114) operatively presents, to a drain of the active device, an optimal resistance at the fundamental frequency; an open-circuit at a second harmonic of the fundamental frequency; and, a short-circuit at a third harmonic of the fundamental frequency.

In one implementation, the fundamental frequency matching circuitry (120) may include a first series-connected transmission line (122) which has a first electrical length ($\theta_1$) at the fundamental frequency ($f_0$). The first series-connected transmission line (122) is electrically interposed between the amplifier circuit (106) and a first junction (124). The fundamental frequency matching circuitry (120) may also include a second series-connected transmission line (126) having a second electrical length ($\theta_2$) at the fundamental frequency ($f_0$). The second series-connected transmission line (126) is electrically interposed between the first junction (124) and the output (110). The fundamental frequency matching circuitry (120) may further include, at the fundamental frequency ($f_0$), a one-twelfth wavelength $$\left(\frac{\lambda}{12}\right)$$

open-circuit stub (128) which is electrically interposed between the second series-connected transmission line (126) and the output (110). Each of the transmission lines has an associated impedance.

The parallel transmission line arrangement (130) includes, at the fundamental frequency ($f_0$), a one-eighth wavelength $$\left(\frac{\lambda}{8}\right)$$

short-circuited stub (132) and, at the fundamental frequency ($f_0$), a one-eighth wavelength $$\left(\frac{\lambda}{8}\right)$$

open-circuit stub (134). Each of the open-circuit and short-circuited stubs (132, 134) extend respectively from the first junction (124) which is electrically coupled to the fundamental frequency matching circuitry (120), in-between the first and second series-connected transmission lines (122, 126), and in turn to the output (110). The open-circuit and short-circuited stubs (132, 134) of the parallel transmission line arrangement (130) have associated impedances.

Figure 3A:
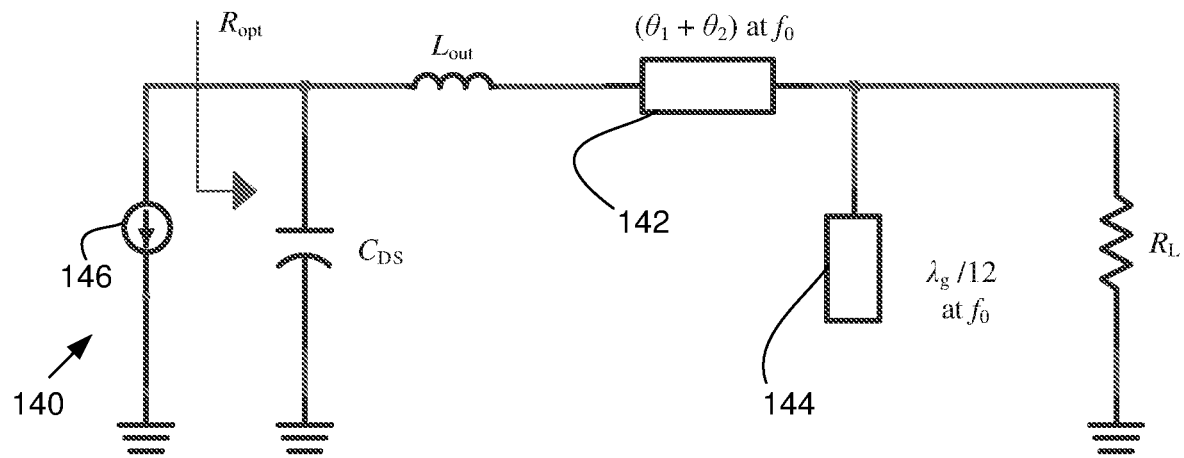
FIG. 3A is a circuit diagram which illustrates the equivalent circuit of the load network illustrated in FIG. 2 at the fundamental frequency.

In operation and at the fundamental frequency ($f_0$), the parallel transmission line arrangement (130) presents an open-circuit condition at the first junction (124). The effect of this is to reduce the load network (114) to an equivalent circuit (140), illustrated in FIG. 3A, which includes a series-connected transmission line (142) and a one-twelfth wavelength $$\left(\frac{\lambda}{12}\right)$$

open-circuit stub (144). The series-connected transmission line (142) has an electrical length equivalent to that of the sum of the first and second series-connected transmission lines (122, 126) ($\theta_1+\theta_2$) of the fundamental frequency matching circuitry (120). The equivalent circuit (140) includes the shunt capacitor ($C_{DS}$) and series inductor ($L_{out}$), a source (146) and a load ($R_L$).

Figure 3B:
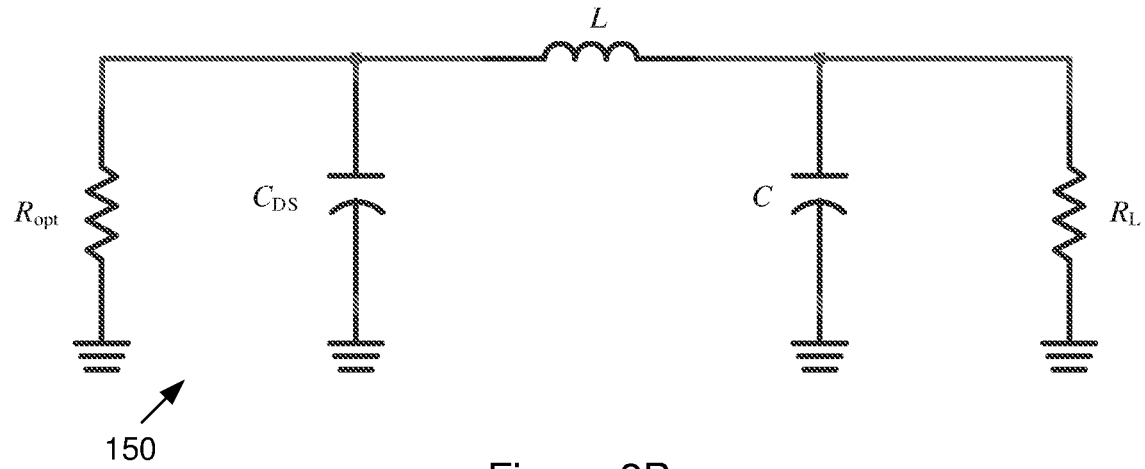
FIG. 3B is a circuit diagram which illustrates a simplified representation of the circuit illustrated in FIG. 3A.

The equivalent circuit (140) can be reduced further to the circuit (150) illustrated in FIG. 3B, in which the one-twelfth wavelength $$\left(\frac{\lambda}{12}\right)$$

open-circuit stub (144) is modelled as a shunt capacitor (C) whose value is given by:

$$C = \frac{\tan(30°)}{Z_2 \omega_0} \text{ Farad} \quad (2)$$

and in which the series-connected transmission line (142) is modelled as a series inductor (L) with a value given by:

$$L = \frac{Z_1 \sin(\theta_1 + \theta_2)}{\omega_0} + L_{out} \text{ Henry} \quad (3)$$

In order for the load resistance ($R_L$) to match the optimum resistance ($R_{opt}$) at the fundamental frequency, the capacitive and inductive components of the resulting low pass $\pi$-type matching network (150) can be calculated using the following equations:

$$C = \frac{Q_L}{R_L \omega_0} \text{ Farad} \quad (4)$$

$$L = \frac{R_{opt}}{\omega_0}\left[\frac{Q_S + Q_L}{Q_S^2 + 1}\right] \text{ Henry} \quad (5)$$

where the source quality factor ($Q_S$) and the load quality factor ($Q_L$) are given by the following two equations:

$$Q_S = R_{opt}\omega_0 C_{DS} \quad (6)$$

$$Q_L = \sqrt{\frac{R_L}{R_{opt}}(1 + Q_S^2) - 1} \quad (7)$$

The above two equations assume that the load resistance ($R_L$) is greater than the optimum resistance ($R_{opt}$). However, this assumption can be disregarded if the source quality factor ($Q_S$) is known.

Figure 4:
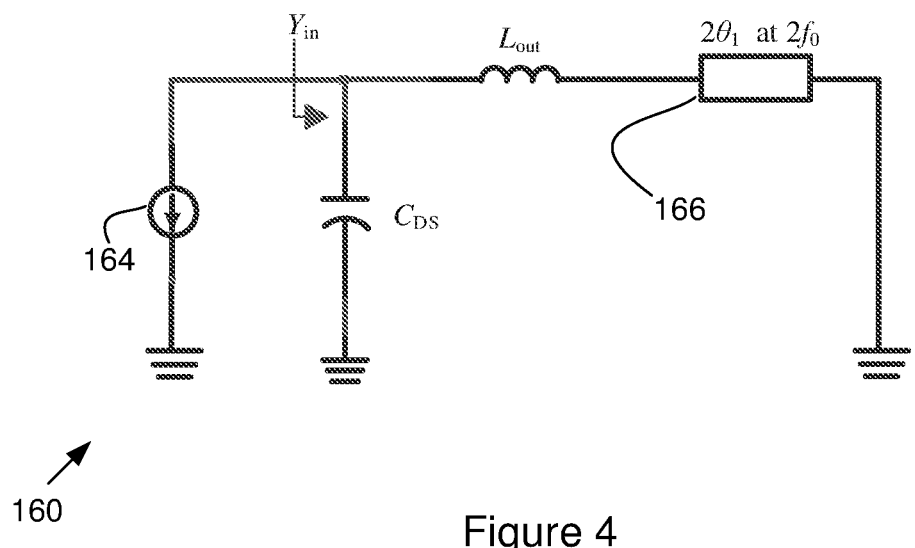
FIG. 4 is a circuit diagram which illustrates the equivalent circuit of the load network illustrated in FIG. 2 at the second harmonic.

In operation and at the second harmonic of the fundamental frequency ($2f_0$), the short-circuited stub (132) and the open-circuit stub (134) have a one-quarter wavelength $$\left(\frac{\lambda}{4}\right)$$

and the parallel transmission line arrangement (130) therefore presents a short-circuit condition at the first junction (124) at this harmonic. This short-circuit condition results in the equivalent load network (160) which is illustrated in FIG. 4. The equivalent load network (160) includes the shunt capacitor ($C_{DS}$) and series inductor ($L_{out}$) as well as a source (164). The equivalent load network (160) also includes a series-connected transmission line (166) which has an electrical length ($2\theta_1$) at the second harmonic ($2f_0$) which is twice that of the first series-connected transmission line (122) at the fundamental frequency ($f_0$).

In order to achieve the required open-circuit condition at the second harmonic ($2f_0$) at the drain of the active device (108), the admittance ($Y_{in}$) presented by the equivalent load network (160) must be equal to zero. That is:

$$j2\omega_0 C_{DS} - \frac{1}{j2\omega_0 L_{out} + jZ_1 \tan 2(\theta_1)} = 0 \quad (8)$$

Now considering operation at the third harmonic of the fundamental frequency ($3f_0$), the short-circuited stub (132) and the open-circuit stub (134) behave as they would at the fundamental frequency ($f_0$) and the parallel transmission line arrangement (130) therefore presents an open-circuit condition at the first junction (124). Furthermore, the open-circuit stub (128) of the fundamental frequency matching circuitry (120) has a one-quarter wavelength $$\left(\frac{\lambda}{4}\right)$$

electrical length and thus presents a short circuit condition at a second junction (168) of the load network (114). This results in an equivalent load network (170) for the third harmonic ($3f_0$) which is illustrated in FIG. 5.

The equivalent load network (170) at the third harmonic ($3f_0$) includes the shunt capacitor ($C_{DS}$) and series inductor ($L_{out}$) as well as a source (172). The equivalent load network (170) at the third harmonic ($3f_0$) also includes a series-connected transmission line (174) which has an electrical length ($3(\theta_1+\theta_2)$) which is equivalent to thrice that of the first and second series-connected transmission lines (122, 126) in combination.

Figure 5:
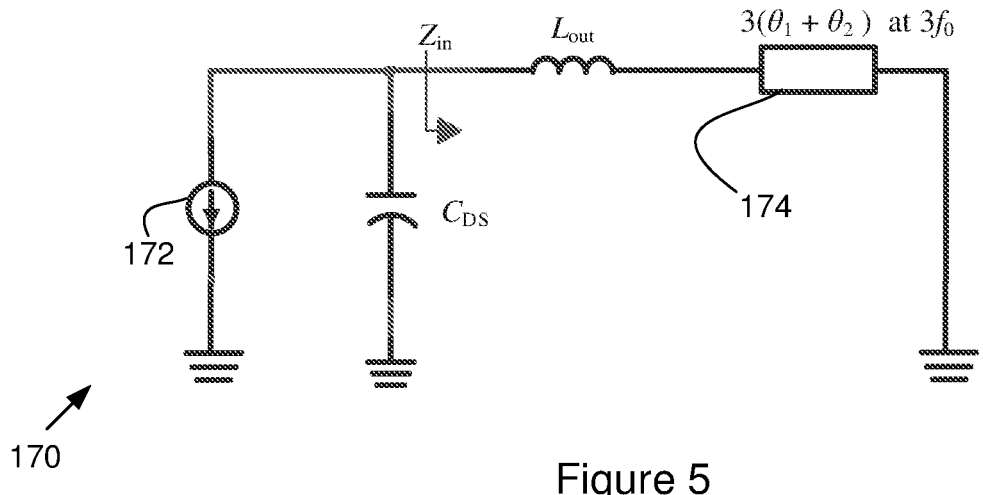
FIG. 5 is a circuit diagram which illustrates the equivalent circuit of the load network illustrated in FIG. 2 at the third harmonic.

In order to achieve the required short-circuit condition at the drain of the active device (108) at the third harmonic ($3f_0$), the impedance ($Z_{in}$) presented by the equivalent load network (170) illustrated in FIG. 5 above must be equal to zero. That is:

$$j3\omega_0 L_{out} + Z_1 \tan 3(\theta_1+\theta_2) = 0 \quad (9)$$

For this condition to be true, the combined electrical length ($3(\theta_1+\theta_2)$) of the series-connected transmission line (174) must be equal to 180° at the third harmonic ($3f_0$) and thus equal to 60° at the fundamental frequency ($f_0$) when parasitic inductance ($L_{out}$) is equal to 0 H.

Manipulating equations (3) (8) and (9) above result in a set of two simultaneous equations with two unknowns, $\theta_1$ and $\theta_2$:

$$\sin(\theta_1 + \theta_2) + \frac{2\omega_0^2 C_{DS}(L - L_{out})}{4\omega_0^2 C_{DS} L_{out} - 1} \tan(2\theta_1) = 0 \quad (10)$$

$$\sin(\theta_1 + \theta_2) - \frac{(L - L_{out})}{3L_{out}} \tan 3(\theta_1 + \theta_2) = 0 \quad (11)$$

Solving the above two equations (10) and (11), using the known constants relevant to the particular PA, will produce the required parameters for the load network (114). In what follows, an exemplary inverse Class-F PA is described and the above two equations are solved to arrive at the relevant parameters for the load network for the PA.

Design of an Exemplary Load Network

The proposed load network was designed to operate at a fundamental frequency ($f_0$) of 2.2 GHz. The optimum resistance ($R_{opt}$) value for a Class-$F^1$ PA is determined using the load line technique, that is, by determining the ratio of the drain voltage ($V_{DD}$) and current ($I_0$) at the fundamental frequency ($f_0$). For the exemplary PA, an optimum resistance ($R_{opt}$) value of 90.428Ω was obtained using equation (1). It should however be appreciated that instead of using the load line technique, the load pull technique may also be used to determine the optimum impedance ($Z_{opt}$) to maximize power conversion efficiency at the fundamental frequency ($f_0$). In such a case, the above described load network (114) can be modified to accommodate an additional output matching network.

In this exemplary PA, a Cree CGH40010F GaN active device was provided which has a drain capacitance ($C_{DS}$) and lead inductor ($L_{out}$) equal to 1.3 pF and 0.653 nH respectively. The values of the capacitor (C) and inductor (L) of the low pass π-type equivalent load matching network (150) illustrated in FIG. 3B may, using equations (4) and (5), be calculated as being 1.456 pF and 4.728 nH respectively. Using these values and equation (2), the characteristic impedance ($Z_2$) of the open-circuit stub (128) of the fundamental frequency matching circuitry (120) can be determined to be 28.686Ω.

Solving the set of equations in (10) and (11), results in the electrical length ($\theta_1$) of the first series-connected transmission line (122) being equal to 3.961° and the electrical length ($\theta_2$) of the second series-connected transmission line (126) being equal to 49.375°.

Initially, an assumption was made that the two series-connected transmission lines (122, 126) would have the same impedance ($Z_1$) in order to simplify the design of the load network. Based on this, the impedance ($Z_1$) of each of the two series-connected transmission lines (122, 126) of the fundamental frequency matching circuitry (120) was determined, using equation (3), to be 70.22Ω respectively. However, an optimization process, described below, was then performed to take into account this assumption.

The characteristic impedance ($Z_0$) of the open-circuit and short-circuited stubs (132, 134) of the parallel transmission line arrangement (130) was selected to be 50Ω.

Figure 6:
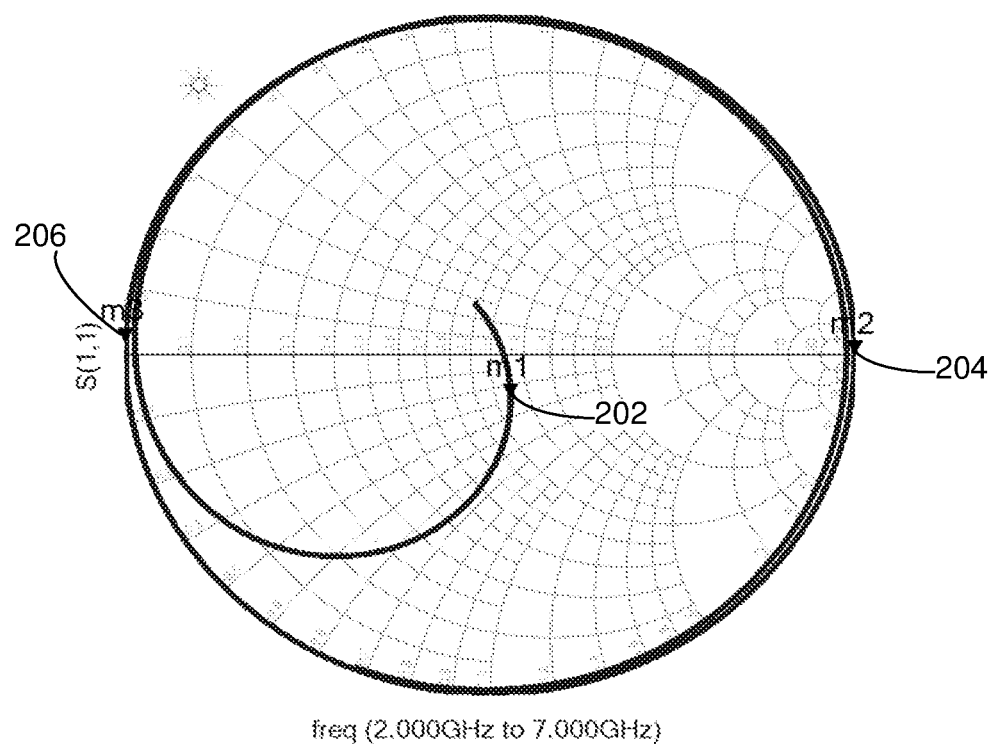
FIG. 6 is a Smith-chart plot which illustrates a simulated input reflection coefficient of the load network illustrated in FIG. 2.

Suitable electronic design automation software, such as Advanced Design System™, was used to perform simulations on the designed load network. The simulated input reflection coefficient of the exemplary load network, with the parameters determined above, is illustrated in FIG. 6. FIG. 6 is a Smith-chart plot which illustrates the simulated input reflection coefficient of the exemplary load network for a range of frequencies. The Figure includes three markers (202, 204, 206) for each of the fundamental frequency ($f_0$), second harmonic ($2f_0$) and third harmonic ($3f_0$) respectively. The first marker (202) represents an input impedance of the load network (which is presented to the active device) being 54.113−j13.960Ω and an S(1,1) value of 0.139/−

65.964 at a frequency of 2.2 GHz. The second marker (204) represents an input impedance of the load network (which is presented to the active device) being 49.27−j2.880×10⁶Ω and an S(1,1) value of 1000×10⁻³/1.990×10⁻³ at a frequency of 4.4 GHz. The third marker (206) represents an input impedance of the load network (which is presented to the active device) being 31.119×10⁻⁹+j925.0×10⁻³Ω and an S(1,1) value of 1000×10⁻³/177.9 at a frequency of 6.6 GHz.

The initial simulation results show that the proposed load network with the parameters described above achieves the required impedance termination for an inverse Class-F PA. However, the optimum resistance ($R_{opt}$) of 90.428Ω is not well matched to the 50Ω load resistance ($R_L$). This is due to the assumption described above, that is, that the two series-connected transmission lines (122, 126) would have the same characteristic impedance ($Z_1$). This assumption was made to simplify the design of the load network. In order to account for the assumption, the load network was optimized using electronic design automation software. Results of the optimization are presented in the table below.

TABLE 1

Calculated vs. optimized values

| Parameters | Calculated values | Optimized values |
|---|---|---|
| $Z_0$ (132, 134) | 50 Ω | 50 Ω |
| $Z_1$ (122) | 70.222 Ω | 70.06 Ω |
| $Z_1$ (126) | 70.222 Ω | 64.29 Ω |
| $\theta_1$ | 3.961° | 3.97° |
| $\theta_2$ | 49.375° | 47.972° |
| $Z_2$ (128) | 28.686 Ω | 26.486 Ω |

Figure 7:
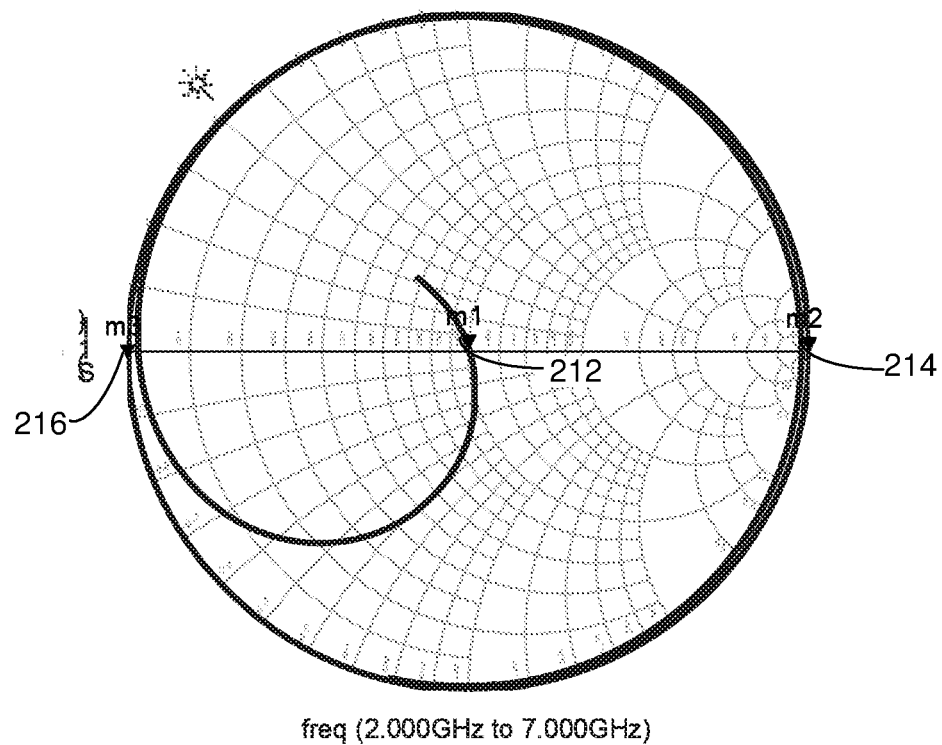
FIG. 7 is a Smith-chart plot which illustrates an optimized simulated input reflection coefficient of the load network illustrated in FIG. 2.

The optimized simulated input reflection coefficient of the exemplary load network, with the parameters described in the table above, is illustrated in FIG. 7. FIG. 7 is a Smith-chart plot which illustrates the optimized simulated input reflection coefficient of the exemplary load network. The Figure includes three markers (212, 214, 216) for each of the fundamental frequency ($f_0$), second harmonic ($2f_0$) and third harmonic ($3f_0$) respectively. The first marker (212), represents an input impedance of the load network of 50.097+j0.715Ω and an S(1,1) value of 0.007/81.879 at a frequency of 2.2 GHz. The second marker (214) represents an input impedance of the load network of 523.4−j9.893×10⁶Ω and an S(1,1) value of 1000×10⁻³/−579.2×10⁻⁶ at a frequency of 4.4 GHz. The third marker (216) represents an input impedance of the load network of 2.754×10⁻⁻⁹−j541.8×10⁻³Ω and an S(1,1) value of 1000×10⁻³/−178.8 at a frequency of 6.6 GHz.

The optimized simulated input reflection coefficient loss illustrated in FIG. 7 shows that the designed load network meets the operational conditions of an inverse Class-F PA while taking into account the parasitic elements of the active device. The load resistance ($R_L$) is matched to the optimum resistance ($R_{opt}$) at the fundamental frequency ($f_0$), as illustrated by the marker (212) in FIG. 7. The input impedance is high enough to be considered as an open-circuit at the second harmonic ($2f_0$) as shown by the second marker (214). Finally, the input impedance is low enough to be considered a short-circuit at the third harmonic ($3f_0$) as shown by the third marker (216).

Figure 8:
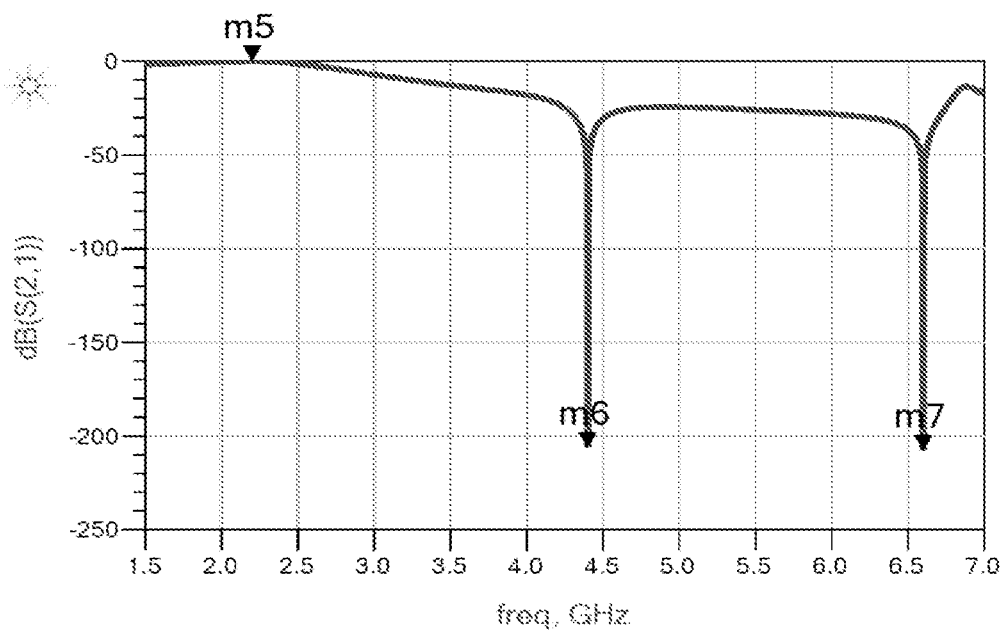
FIG. 8 is a graph which illustrates a simulated transfer function of the load network illustrated in FIG. 2.

FIG. 8 is a graph which illustrates the simulated transfer function of the optimized simulated load network described above. The simulated attenuation of the load network is 206 dB and 207 dB at the second harmonic ($2f_0$) and third harmonic ($3f_0$) respectively. This suggests that the inverse Class-F PA designed with this load network will exhibit a good harmonic suppression and therefore power delivered to the load at the second and third harmonics will be minimized, thereby increasing efficiency of the PA.

The load network described herein provides a parallel transmission line arrangement (130) which includes an open-circuit one-eighth wavelength transmission line in parallel with a short circuited one-eighth wavelength transmission line. In a comparison between a conventional quarter wave impedance transformer and the above described parallel transmission line arrangement (130), it was found that the rejection band of the parallel combination of an open and a short-circuited one-eighth wavelength stub is twice that of the quarter wave impedance transformer. The physical length of the one-eighth wavelength stub is half that of the quarter wave impedance transformer. Thus a lower electrical series resistance (ESR) results in turn leading to a better short circuit condition. The length of the parallel transmission line arrangement (130) described herein may also reduce the physical size of the PA.

A one-eighth wavelength transmission line with a short circuit load is equivalent to an ideal capacitor, that is, the input impedance the transmission line ($Z_{in}$) is equal to $0-j(\omega C)^{-1}$ Ω. Similarly, a one-eighth wavelength line with an open circuit load is equivalent to an ideal inductor, that is, the input impedance the transmission line ($Z_{in}$) is equal to $0+j(\omega L)$ Ω. The arrangement of the one-eighth wavelength transmission lines described herein is such that the equivalent circuit is a parallel resonant circuit. The characteristics of a parallel resonant circuit are that it presents a very high impedance at its input port at resonance and very low impedances at its input port at signal frequencies below and above the resonant frequency. Further, the actual resistance of the copper of the actual transmission line sections may be very low, which results in a very high Q, which in turn results is a very narrow bandwidth, thereby ensuring that only the fundamental component of the drain signal reaches the load resistance and all other even harmonics are prevented from getting reaching the load.

Accordingly, the parallel transmission line arrangement (130) including the one-eighth wavelength short circuit transmission line and the one-eighth wavelength open-circuit transmission line described herein forms a very high Q parallel resonant circuit with a very high input impedance at the fundamental frequency and all odd harmonics.

At all even harmonics the parallel transmission line arrangement (130) forms a short-circuit path to ground which prevents these even harmonic components from reaching the load. Accordingly, the inverse Class-F PA described herein may better meet the necessary and sufficient conditions for improved efficiency over existing PAs.

Figure 9:
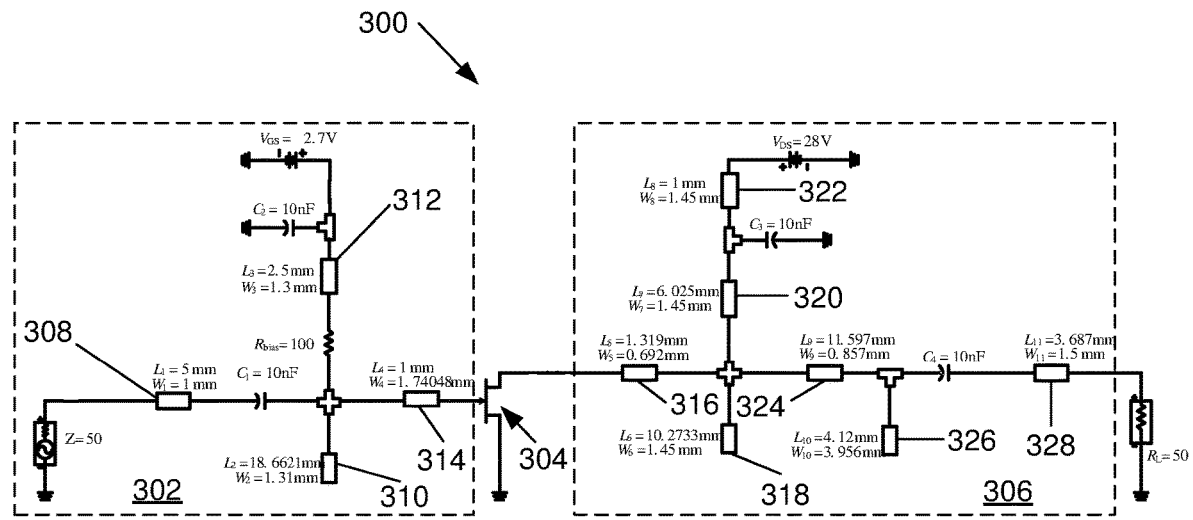
FIG. 9 is a circuit diagram which illustrates a physically implemented and tested inverse Class-F power amplifier in accordance with the disclosure.

FIG. 9 shows a circuit diagram of an implemented PA (300) in accordance with the disclosure. The PA (300) includes an input matching network (302), an active device (304) and a load network (306). All the electronic components used in this embodiment are simulated, real world components, as opposed to components with theoretical values obtained from calculations, where the transmission line sections (308-328) are in the form of interconnecting printed circuit board (PCB) tracks. The required physical widths and lengths of the interconnecting transmission line sections (308-328) are synthesized with the use of suitable electronic design automation software, presently Advanced Design System (ADS). The addition of the interconnecting transmission line sections (308-328) necessitated the optimization of the input matching network (302) and the load network (306) to compensate for the effect thereof.

Figure 10:
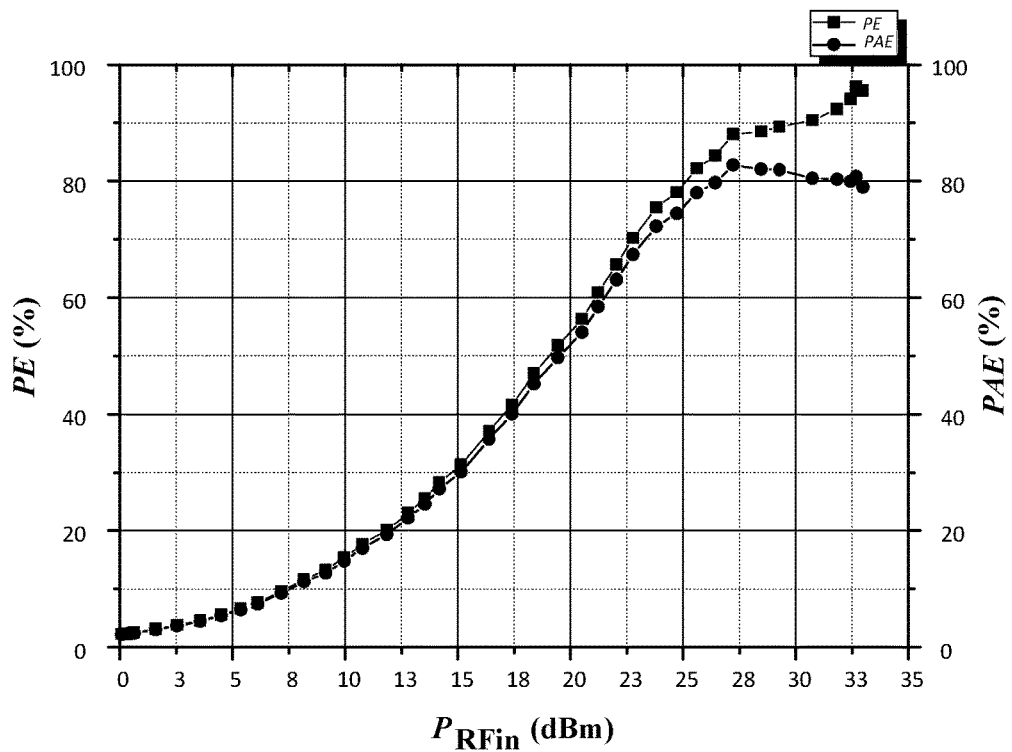
FIG. 10 is a graph which illustrates the results obtained for the implemented inverse Class-F power amplifier illustrated in FIG. 9.

FIG. 10 contains a graph illustrating the relationship between the measured power conversion efficiency (PE), the power added efficiency (PAE) and the input power supplied to the implemented PA (300). This Figure shows that a PE of 95% is achieved at an input power level of 33 dBm and a maximum PAE of 82% is measured at an input power level of 28 dBm. Therefore, 95% of the supplied DC power is converted into useful RF power and only 5% of this supplied power is dissipated as heat. Results of the simulated and practically implemented designs are presented in the table below.

TABLE 2

Comparison between simulated and practical results

| Performance parameters | Simulated | Measured |
|---|---|---|
| PE (%) | 88.5 | 95 |
| PAE (%) | 85 | 82 |
| Output power (dBm) | 40 | 40.6 |
| Power gain (dB) | 20 | 14 |

When compared to one of the best performing commercially available Class-$F^{-1}$ PA's, the Gebrennikov PA, the practically implemented PA (300) of the present disclosure performs significantly better. The practically implemented PA of the present disclosure has a PE of 95% (as shown in Table 2), whereas the Gebrennikov PA, when implemented, has a PE of 76% using exactly the same active device. Similarly, the PAE attained by the practically implemented PA (300) is 82% which is 10% higher than the PAE achieved by the Gebrennikov PA.

As mentioned above, the load network described in the foregoing was designed using the load line technique to determine the optimum resistance for maximum power conversion efficiency at the fundamental frequency. However, the load pull technique can also be used to determine the optimum impedance for maximum power conversion efficiency at the fundamental frequency. In such a case the proposed load network would be modified to accommodate an additional output matching network.

The load network described herein may be implemented in any suitable inverse Class-F PA. In some cases, the load network may be implemented as a part of an inverse Class-F PA used in a wireless communication system. Exemplary wireless communication systems include terrestrial systems, such as cellular communication networks and the like, or satellite-based systems. It should be appreciated that the inverse Class-F PA herein described may find application in other technology sectors.

The term "load network" used herein may also be referred to as a wave shaping network or an output matching network. The term "load network" may refer to any suitable arrangement of components whose function is to ensure that the drain of an active device of an inverse Class-F PA is terminated with the optimum impedance at the fundamental frequency, an open-circuit at even harmonic frequencies and a short circuit at odd harmonic frequencies. The load network should also absorb the parasitic elements of the active device to minimize their effect on the drain power conversion efficiency.

"Transmission lines" referred to herein include any suitable structure designed to carry alternating current with a frequency high enough that their wave nature must be taken into account. The transmission lines referred to herein may be provided by a coaxial cable, stripline, microstrip, waveguide, dielectric waveguide or the like.

The term "stub" as used herein refers to a length of transmission line which is connected at one end only, the free end being either left open-circuit or short-circuited.

The foregoing description has been presented for the purpose of illustration; it is not intended to be exhaustive or to limit the invention to the precise forms disclosed. Persons skilled in the relevant art can appreciate that many modifications and variations are possible in light of the above disclosure.

Some portions of this description describe the embodiments of the invention in terms of algorithms and symbolic representations of operations on information. These algorithmic descriptions and representations are commonly used by those skilled in the relevant art to convey the substance of their work effectively to others skilled in the art.

The language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based hereon. Accordingly, the disclosure of the embodiments of the invention is intended to be illustrative, but not limiting, of the scope of the invention, which is set forth in the following claims.

Finally, throughout the specification unless the contents requires otherwise the word 'comprise' or variations such as 'comprises' or 'comprising' will be understood to imply the inclusion of a stated integer or group of integers but not the exclusion of any other integer or group of integers.

The invention claimed is:

1. An inverse Class F power amplifier comprising:
   an input for receiving a signal to be amplified, the signal being associated with a fundamental frequency;
   an amplifier circuit including an active device for amplifying the input signal;
   an output for providing the amplified signal to a load; and,
   a load network electrically interposed between the amplifier circuit and the output and including:
   fundamental frequency matching circuitry which presents an optimal resistance at the fundamental frequency and a parallel transmission line arrangement the parallel transmission line arrangement including, at the fundamental frequency, a one-eighth wavelength short-circuited stub and, at the fundamental frequency, a one-eighth wavelength open-circuit stub wherein the fundamental frequency matching circuitry is arranged to cooperate with the parallel transmission line arrangement such that the load network operatively presents:
   an optimal resistance at the fundamental frequency,
   an open-circuit at a second harmonic of the fundamental frequency, and
   a short-circuit at a third harmonic of the fundamental frequency.

2. The inverse Class F power amplifier as claimed in claim 1, wherein the fundamental frequency matching circuitry includes a first portion and a second portion and the parallel transmission line arrangement is interposed between the first and second portions.

3. The inverse Class F power amplifier as claimed in claim 1, wherein the one-eighth wavelength stubs each respectively extends from a first junction which is electrically coupled to the fundamental frequency matching circuitry and to the output.

4. The inverse Class F power amplifier as claimed in claim 1, wherein the parallel transmission line arrangement operatively presents, at the first junction an open-circuit condition at the fundamental frequency, a short-circuit condition at a second harmonic of the fundamental frequency and an open-circuit condition at a third harmonic of the fundamental frequency.

5. The inverse Class F power amplifier as claimed in claim 1, wherein the fundamental frequency matching circuitry includes a first series-connected transmission line having a first electrical length at the fundamental frequency and being electrically interposed between the amplifier circuit and the first junction.

6. The inverse Class F power amplifier as claimed in claim 1, wherein the fundamental frequency matching circuitry includes a second series-connected transmission line having a second electrical length at the fundamental frequency and being electrically interposed between the first junction and the output.

7. The inverse Class F power amplifier as claimed in claim 6, wherein the fundamental frequency matching circuitry includes at the fundamental frequency, a one-twelfth wavelength open-circuit stub electrically interposed between the second series-connected transmission line and the output.

8. A load network for an inverse Class F power amplifier the load network being arranged to be electrically interposed between an amplifier circuit and an output of the power amplifier and comprising:
   fundamental frequency matching circuitry which presents an optimal resistance at a fundamental frequency associated with a signal to be amplified; and,
   a parallel transmission line arrangement the parallel transmission line arrangement including, at the fundamental frequency, a one-eighth wavelength short-circuited stub and, at the fundamental frequency, a one-eighth wavelength open-circuit stub each of which extends respectively from a first junction which is electrically coupled to the fundamental frequency matching circuitry and which is arranged to be electrically coupled to the output
   wherein the fundamental frequency matching circuitry is arranged to cooperate with the parallel transmission line arrangement such that the load network operatively presents:
   an optimal resistance at the fundamental frequency,
   an open-circuit at a second harmonic of the fundamental frequency, and
   a short-circuit at a third harmonic of the fundamental frequency.

9. The load network as claimed in claim 8, wherein the parallel transmission line arrangement presents, at the first junction an open-circuit condition at the fundamental frequency, a short-circuit condition at a second harmonic of the fundamental frequency and an open-circuit condition at a third harmonic of the fundamental frequency.

10. The load network as claimed in claim 8, wherein the fundamental frequency matching circuitry includes a first series-connected transmission line having a first electrical length at the fundamental frequency, a first end of which is configured to be electrically connected to the amplifier circuit and a second end of which is electrically connected to the first junction.

11. The load network as claimed in claim 8, wherein the fundamental frequency matching circuitry includes a second series-connected transmission line having a second electrical length at the fundamental frequency, a first end of which is electrically connected to the first junction and a second end of which is configured to be electrically connected to the output.

12. The load network as claimed in claim 11, wherein the fundamental frequency matching circuitry includes, at the fundamental frequency, a one-twelfth wavelength open-circuit stub electrically interposed between the second series-connected transmission line and the output.

13. A method of providing a load network for an inverse Class F power amplifier the method comprising the step of:
   arranging the load network to be electrically interposed between an amplifier circuit and an output of the amplifier, the load network including frequency matching circuitry for presenting an optimal resistance at a fundamental frequency associated with a signal to be amplified and a parallel transmission line arrangement the parallel transmission line arrangement including, at the fundamental frequency, a one-eighth wavelength short-circuited stub and, at the fundamental frequency, a one-eighth wavelength open-circuit stub each extending respectively from a first junction which is electrically coupled to the fundamental frequency matching circuitry and which is arranged to be electrically coupled to the output
   wherein the fundamental frequency matching circuitry is arranged to cooperate with the parallel transmission line arrangement such that the load network operatively presents:
   an optimal resistance at the fundamental frequency,
   an open-circuit at a second harmonic of the fundamental frequency, and
   a short-circuit at a third harmonic of the fundamental frequency.

* * * * *